US006573126B2

(12) United States Patent
Cheng et al.

(10) Patent No.: US 6,573,126 B2
(45) Date of Patent: Jun. 3, 2003

(54) PROCESS FOR PRODUCING SEMICONDUCTOR ARTICLE USING GRADED EPITAXIAL GROWTH

(75) Inventors: Zhi-Yuan Cheng, Cambridge, MA (US); Eugene A. Fitzgerald, Windham, NH (US); Dimitri A. Antoniadis, Newton, MA (US); Judy L. Hoyt, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/928,126

(22) Filed: Aug. 10, 2001

(65) Prior Publication Data

US 2002/0072130 A1 Jun. 13, 2002

Related U.S. Application Data

(60) Provisional application No. 60/225,666, filed on Aug. 16, 2000.

(51) Int. Cl.$^7$ .............................................. H01L 21/00
(52) U.S. Cl. ....................................... 438/149; 438/933
(58) Field of Search ................................ 438/149, 761, 438/763, 478–479, 483, 506–507, 522, 530

(56) References Cited

U.S. PATENT DOCUMENTS 4,010,045 A    3/1977   Ruehrwein (List continued on next page.)

FOREIGN PATENT DOCUMENTS

| EP | 0 587 520 | 3/1994 |
| EP | 0 683 522 | 11/1995 |
| EP | 0 828 296 | 3/1998 |
| JP | 2000-31491 | 1/2000 |
| JP | 2001319935 | 5/2000 |
| JP | 2002-164520 | 6/2002 |
| WO | WO 98/59365 | 12/1998 |
| WO | WO 99/53539 | 10/1999 |
| WO | WO 00/48239 | 8/2000 |
| WO | WO 01/54202 | 7/2001 |
| WO | WO 01/99169 A2 | 12/2001 |
| WO | WO 02/15244 A2 | 2/2002 |
| WO | WO 02/27783 A1 | 4/2002 |
| WO | WO 02/071495 A1 | 9/2002 |
| WO | WO 02/082514 A1 | 10/2002 |

OTHER PUBLICATIONS

IBM Technical Disclosure Bulletin, vol. 32, No. 8A, Jan. 1990; "Optimal Growth Technique and Structure for Strain Relaxation of Si–Ge Layers on Si Substrates"; pp. 330–331.

Ishikawa et al., "SiGe–on–insulator substrate using SiGe alloy grown Si(001)," *Applied Physics Letters*, vol 75, No. 7 (Aug. 16, 1999) pp. 983–985.

(List continued on next page.)

*Primary Examiner*—Carl Whitehead, Jr.
*Assistant Examiner*—Craig Thompson
(74) *Attorney, Agent, or Firm*—Testa, Hurwitz & Thibeault, LLP

(57) ABSTRACT

A process for producing monocrystalline semiconductor layers. In an exemplary embodiment, a graded $Si_{1-x}Ge_x$ (x increases from 0 to y) is deposited on a first silicon substrate, followed by deposition of a relaxed $Si_{1-y}Ge_y$ layer, a thin strained $Si_{1-z}Ge_z$ layer and another relaxed $Si_{1-y}Ge_y$ layer. Hydrogen ions are then introduced into the strained $Si_zGe_z$ layer. The relaxed $Si_{1-y}Ge_y$ layer is bonded to a second oxidized substrate. An annealing treatment splits the bonded pair at the strained Si layer, such that the second relaxed $Si_{1-y}Ge_y$ layer remains on the second substrate. In another exemplary embodiment, a graded $Si_{1-x}Ge_x$ is deposited on a first silicon substrate, where the Ge concentration x is increased from 0 to 1. Then a relaxed GaAs layer is deposited on the relaxed Ge buffer. As the lattice constant of GaAs is close to that of Ge, GaAs has high quality with limited dislocation defects. Hydrogen ions are introduced into the relaxed GaAs layer at the selected depth. The relaxed GaAs layer is bonded to a second oxidized substrate. An annealing treatment splits the bonded pair at the hydrogen ion rich layer, such that the upper portion of relaxed GaAs layer remains on the second substrate.

44 Claims, 5 Drawing Sheets

U.S. PATENT DOCUMENTS

| | | | |
|---|---|---|---|
| 5,013,681 A | | 5/1991 | Godbey et al. |
| 5,166,084 A | | 11/1992 | Pfiester |
| 5,202,284 A | | 4/1993 | Kamins et al. |
| 5,207,864 A | | 5/1993 | Bhat et al. |
| 5,208,182 A | | 5/1993 | Narayan et al. |
| 5,212,110 A | | 5/1993 | Pfiester et al. |
| 5,221,413 A | | 6/1993 | Brasen et al. |
| 5,285,086 A | | 2/1994 | Fitzgerald |
| 5,310,451 A | | 5/1994 | Tejwani et al. |
| 5,346,848 A | | 9/1994 | Grupen-Shemansky et al. |
| 5,374,564 A | | 12/1994 | Bruel |
| 5,413,679 A | | 5/1995 | Godbey |
| 5,442,205 A | | 8/1995 | Brasen et al. |
| 5,461,243 A | * | 10/1995 | Ek et al. ............ 257/190 |
| 5,462,883 A | | 10/1995 | Dennard et al. |
| 5,476,813 A | | 12/1995 | Naruse |
| 5,484,664 A | | 1/1996 | Kitahara et al. |
| 5,523,592 A | | 6/1996 | Nakagawa et al. |
| 5,534,713 A | | 7/1996 | Ismail et al. |
| 5,536,361 A | | 7/1996 | Kondo et al. |
| 5,540,785 A | | 7/1996 | Dennard et al. |
| 5,683,934 A | | 11/1997 | Candelaria |
| 5,728,623 A | | 3/1998 | Mori |
| 5,759,898 A | | 6/1998 | Ek et al. |
| 5,792,679 A | | 8/1998 | Nakato |
| 5,877,070 A | | 3/1999 | Goesele et al. |
| 5,891,769 A | | 4/1999 | Hong et al. |
| 5,906,708 A | | 5/1999 | Robinson et al. |
| 5,906,951 A | | 5/1999 | Chu et al. |
| 5,943,560 A | | 8/1999 | Chang et al. ............ 419/96 |
| 5,966,622 A | | 10/1999 | Levine et al. |
| 5,998,807 A | | 12/1999 | Lustig et al. |
| 6,033,974 A | | 3/2000 | Henley et al. |
| 6,033,995 A | | 3/2000 | Muller |
| 6,059,895 A | | 5/2000 | Chu et al. |
| 6,074,919 A | | 6/2000 | Gardner et al. |
| 6,096,590 A | | 8/2000 | Chan et al. |
| 6,103,559 A | | 8/2000 | Gardner et al. |
| 6,111,267 A | | 8/2000 | Fischer et al. |
| 6,107,653 A | | 9/2000 | Fitzgerald |
| 6,117,750 A | | 9/2000 | Bensahel et al. |
| 6,153,495 A | | 11/2000 | Kub et al. |
| 6,154,475 A | | 11/2000 | Soref et al. |
| 6,162,688 A | | 12/2000 | Gardner et al. |
| 6,184,111 B1 | | 2/2001 | Henley et al. |
| 6,191,007 B1 | | 2/2001 | Matsui et al. |
| 6,191,432 B1 | | 2/2001 | Sugiyama et al. |
| 6,194,722 B1 | | 2/2001 | Howe et al. |
| 6,207,977 B1 | | 3/2001 | Augusto |
| 6,210,988 B1 | | 4/2001 | Howe et al. |
| 6,218,677 B1 | | 4/2001 | Broekaert |
| 6,232,138 B1 | | 5/2001 | Fitzgerald et al. |
| 6,235,567 B1 | | 5/2001 | Huang |
| 6,251,755 B1 | | 6/2001 | Furukawa et al. |
| 6,261,929 B1 | | 7/2001 | Gehrke et al |
| 6,291,321 B1 | | 9/2001 | Fitzgerald |
| 6,313,016 B1 | * | 11/2001 | Kibbel et al. ............ 438/478 |
| 6,323,108 B1 | * | 11/2001 | Kub et al. ............ 438/458 |
| 6,335,546 B1 | | 1/2002 | Tsuda et al. |
| 6,350,993 B1 | | 2/2002 | Chu et al. |
| 6,368,733 B1 | | 4/2002 | Nishinaga |
| 6,372,356 B1 | | 4/2002 | Thornton et al. |
| 2001/0003269 A1 | | 6/2001 | Wu et al. |
| 2002/0096717 A1 | | 7/2002 | Chu et al. |
| 2002/0140031 A1 | | 10/2002 | Rim |
| 2003/0003679 A1 | | 1/2003 | Doyle et al. |

OTHER PUBLICATIONS

Mizuno et al., "Electron and Hold Mobility Enhancement in Strained–Si MOSFET's on SiGe–on–Insulator Substrates Fabricated by SIMOX Technology", *IEEE Electron Device Letters*, vol. 21, No. 5 (May 2000) pp. 230–232.

Yeo et al., "Nanoscale Ultra–Thin–Body Silicon–on–Insulator P–MOSFET with a SiGe/Si Heterostructure Channel", *IEEE Electron Device Letters*, vol. 21, No. 4 (Apr. 2000) pp. 161–163.

Hackbarth et al., "Alternatives to thick MBE–grown relaxed SiGe buffers", *Thin Solid Films*, vol. 369, No. 1–2 (Jul. 2000) pp. 148–151.

Barradas et al., "RBS analysis of MBE–grown SiGe/(001) Si heterostructures with thin, high Ge content SiGe channels for HMOS transistors", *Modern Physics Letters B*(2001) (abstract).

Zhang et al., "Demonstration of a GaAs–Based Compliant Substrate Using Wafer Bonding and Substrate Removal Techniques", Electronic Materials and Processing Research Laboratory, Department of Electrical Engineering, University Park, PA 16802 (1998) pp. 25–28.

Sadek et al., "Design of Si/SiGe Heterojunction Complementary Metal–Oxide–Semiconductor Transistors", *IEEE Trans. Electron Devices*(Aug. 1996) pp. 1224–1232.

Usami et al., "Spectroscopic Study of Si–based quantum wells with neighboring confinement structure", *Semicon. Sci. Technol.*(1997) (abstract).

König et al., "Design Rules for n–Type SiGe Hetero FETs", *Solid State Electronics*, vol. 41, No. 10 (1997), pp. 1541–1547.

Maiti et al., "Strained–Si heterostructure field effect transistors", *Semicond. Sci. Technol.*, vol. 13 (1998) pp. 1225–1246.

Borenstein et al., "A New Ultra–Hard Etch–Stop Layer for High Precision Micromachining", *Proceedings of the 1999 12 th IEEE International Conference on Micro Electri Mechanical Systems(MEM)* (Jan. 17–21, 1999) pp. 205–210.

Feijoo et al., "Epitaxial Si–Ge Etch Stop Layers with Ethylene Diamine Pyrocatechol for Bonded and Etchback Silicon–on–Insulator", *Journal of Electronic Materials*, vol. 23, No. 6 (Jun. 1994) pp. 493–496.

Ismail, "Si/SiGe High–Speed Field–Effect Transistors", *Electron Devices Meeting, Washington, D.C.*(Dec. 10, 1995) pp. 20.1.1–20.1.4.

Fitzgerald et al., "Totally Relaxed $Ge_xSi_{1-x}$ Layers with Low Threading Dislocation Densities Grown on Si Substrates", *Applied Physics Letters*, vol. 59, No. 7 (Aug. 12, 1991) pp. 811–813.

Fitzgerald et al., "Relaxed $Ge_xSi_{1-x}$ structures for III–V integration with Si and high mobility two–dimensional electron gases in Si", AT&T Bell Laboratories, Murray Hill, NJ 07974 (1992) *American Vacuum Society*, pp. 1807–1819.

Maszara, "Silicon–On–Insulator by Wafer Bonding: A Review", *Journal of the Electrochemical Society*, No. 1 (Jan. 1991) pp. 341–347.

Chang et al., "Selective Etching of SiGe/Si Heterostructures", *Journal of the Electrochemical Society*, No. 1 (Jan. 1991) pp. 202–204.

Bruel, "Silicon on Insulator Material Technology," *Electronic Letters*, vol. 13, No. 14 (Jul. 6, 1995) pp. 1201–1202.

Bruel et al., "®Smart Cut: A Promising New SOI Material Technology," *Proceedings 1995 IEEE International SOI Conference* (Oct. 1995)) pp. 178–179.

Ishikawa et al., "Creation of Si–Ge–based SIMOX Structures by low energy oxygen implantation," *Proceedings 1997 IEEE International SOI Conference* (Oct. 1997) pp. 16–17.

Huang et al., "High–quality strain–relaxed SiGe alloy grown on implanted silicon–on–insulator substrate," *Applied Physics Letters*, vol. 76, No. 19 (May 8, 2000) pp. 2680–2682.

* cited by examiner

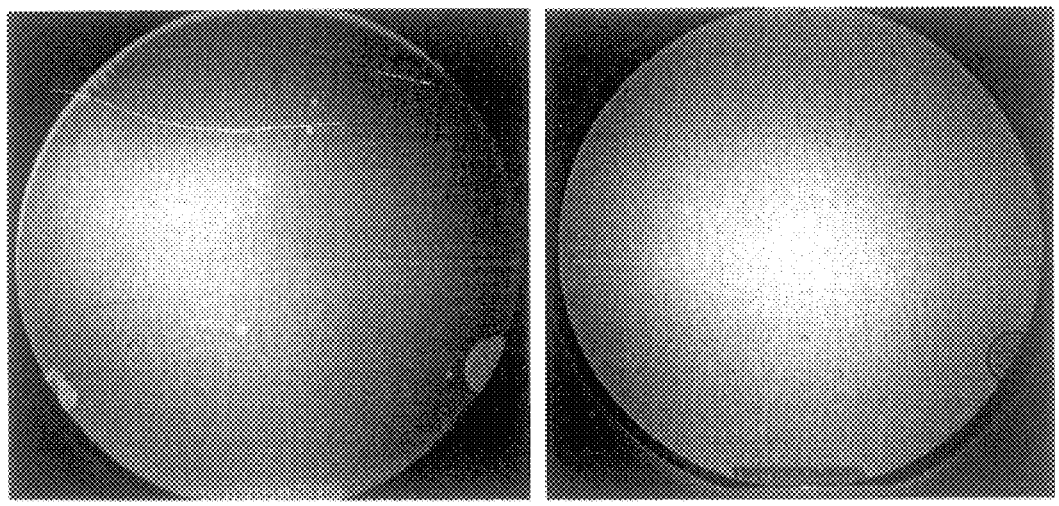
*FIG. 2A*  *FIG. 2B*

PROCESS FOR PRODUCING SEMICONDUCTOR ARTICLE USING GRADED EPITAXIAL GROWTH

This application claims priority from provisional application Ser. No. 60/225,666 filed Aug. 16, 2000.

BACKGROUND OF THE INVENTION

The present invention relates to a production of a general substrate of relaxed $Si_{1-x}Ge_x$-on-insulator (SGOI) for various electronics or optoelectronics applications, and the production of monocrystalline III–V or II–VI material-on-insulator substrate.

Relaxed $Si_{1-x}Ge_x$-on-insulator (SGOI) is a very promising technology as it combines the a benefits of two advanced technologies: the conventional SOI technology and the disruptive SiGe technology. The SOI configuration offers various advantages associated with the insulating substrate, namely reduced parasitic capacitances, improved isolation, reduced short-channel-effect, etc. High mobility strained-Si, strained-$Si_{1-x}Ge_x$ or strained-Ge MOS devices can be made on SGOI substrates.

Other III–V optoelectronic devices can also be integrated into the SGOI substrate by matching the lattice constants of III–V materials and the relaxed $Si_{1-x}Ge_x$. For example a GaAs layer can be grown on $Si_{1-x}Ge_x$-on-insulator where x is equal or close to 1. SGOI may serve as an ultimate platform for high speed, low power electronic and optoelectronic applications.

SGOI has been fabricated by several methods in the prior art. In one method, the separation by implantation of oxygen (SIMOX) technology is used to produce SGOI. High dose oxygen implant was used to bury high concentrations of oxygen in a $Si_{1-x}Ge_x$ layer, which was then converted into a buried oxide (BOX) layer upon annealing at high temperature (for example, 1350° C.). See, for example, Mizuno et al. IEEE Electron Device Letters, Vol. 21, No. 5, pp. 230–232, 2000 and Ishilawa et al. Applied Physics Letters, Vol. 75, No. 7, pp. 983–985, 1999. One of the main drawbacks is the quality of the resulting $Si_{1-x}Ge_x$ film and BOX. In addition, Ge segregation during high temperature anneal also limits the maximum Ge composition to a low value.

U.S. Pat. Nos. 5,461,243 and 5,759,898 describe a second method, in which a conventional silicon-on-insulator (SOI) substrate was used as a compliant substrate. In the process, an initially strained $Si_{1-x}Ge_x$ layer was deposited on a thin SOI substrate. Upon an anneal treatment, the strain was transferred to the thin silicon film underneath, resulting in relaxation of the top $Si_{1-x}Ge_x$ film. The final structure is relaxed-SiGe/strained-Si/insulator, which is not an ideal SGOI structure. The silicon layer in the structure is unnecessary, and may complicate or undermine the performance of devices built on it. For example, it may form a parasitic back channel on this strained-Si, or may confine unwanted electrons due to the band gap offset between the strained-Si and SiGe layer.

U.S. Pat. Nos. 5,906,951 and 6,059,895 describe the formation of a similar SGOI structure: strained-layer(s)/relaxed-SiGe/Si/insulator structure. The structure was produced by wafer bonding and etch back process using a $P^{++}$ layer as an etch stop. The presence of the silicon layer in the above structure may be for the purpose of facilitating Si-insulator wafer bonding, but is unnecessary for ideal SGOI substrates. Again, the silicon layer may also complicate or undermine the performance of devices built on it. For example, it may form a parasitic back channel on this strained-Si, or may confine unwanted electrons due to the band gap offset between the strained-Si and SiGe layer. Moreover, the etch stop of $P^{++}$ in the above structure is not practical when the first graded $Si_{1-y}Ge_y$ layer described in the patents has a y value of larger than 0.2. Experiments from research shows $Si_{1-y}Ge_y$ with y larger than 0.2 is a very good etch stop for both KOH and TMAH, as described in a published PCT application WO 99/53539. Therefore, the KOH will not be able to remove the first graded $Si_{1-y}Ge_y$ layer and the second relaxed SiGe layer as described in the patents.

Other attempts include re-crystallization of an amorphous $Si_{1-x}Ge_x$ layer deposited on the top of SOI (silicon-on-insulator) substrate, which is again not an ideal SGOI substrate and the silicon layer is unnecessary, and may complicate or undermine the performance of devices built on it. Note Yeo et al. IEEE Electron Device Letters, Vol. 21, No. 4, pp. 161–163, 2000. The relaxation of the resultant SiGe film and quality of the resulting structure are main concerns.

From the above, there is a need for a simple technique for relaxed SGOI substrate production, a need for a technique for production of high quality SGOI and other III–V material-on-insulator, and a need for a technique for wide range of material transfer.

SUMMARY OF THE INVENTION

According to the invention, there is provided an improved technique for production of wide range of high quality material is provided. In particular, the production of relaxed $Si_{1-x}Ge_x$-on-insulator (SGOI) substrate or relaxed III–V or II–VI material-on-insulator, such as GaAs-on-insulator, is described. High quality monocrystalline relaxed SiGe layer, relaxed Ge layer, or other relaxed III–V material layer is grown on a silicon substrate using a graded $Si_{1-x}Ge_x$ epitaxial growth technique. A thin film of the layer is transferred into an oxidized handle wafer by wafer bonding and wafer splitting using hydrogen ion implantation. The invention makes use of the graded $Si_{1-x}Ge_x$ buffer structure, resulting in a simplified and improved process.

The invention also provides a method allowing a wide range of device materials to be integrated into the inexpensive silicon substrate. For example, it allows production of $Si_{1-x}Ge_x$-on-insulator with wide range of Ge concentration, and allows production of many III–V or II–VI materials on insulator like GaAs, AlAs, ZnSe and InGaP. The use of graded $Si_{1-x}Ge_x$ buffer in the invention allows high quality materials with limited dislocation defects to be produced and transferred. In one example, SGOI is produced using a SiGe structure in which a region in the graded buffer can act as a natural etch stop.

The invention provides a process and method for producing monocrystalline semiconductor layers. In an exemplary embodiment, a graded $Si_{1-x}Ge_x$ (x increases from 0 to y) is deposited on a first silicon substrate, followed by deposition of a relaxed $Si_{1-y}Ge_y$ layer, a thin strained $Si_{1-z}Ge_z$ layer and another relaxed $Si_{1-y}Ge_y$ layer. Hydrogen ions are then introduced into the strained $Si_zGe_z$ layer. The relaxed $Si_{1-y}Ge_y$ layer is bonded to a second oxidized substrate. An annealing treatment splits the bonded pair at the strained Si layer, whereby the second relaxed $Si_{1-y}Ge_y$ layer remains on said second substrate.

In another exemplary embodiment, a graded $Si_{1-x}Ge_x$ is deposited on a first silicon substrate, where the Ge concentration x is increased from 0 to 1. Then a relaxed GaAs layer is deposited on the relaxed Ge buffer. As the lattice constant of GaAs is close to that of Ge, GaAs has high quality with limited dislocation defects. Hydrogen ions are introduced into the relaxed GaAs layer at the selected depth. The relaxed GaAs layer is bonded to a second oxidized substrate. An annealing treatment splits the bonded pair at the hydrogen ion rich layer, whereby the upper portion of relaxed GaAs layer remains on said second substrate.

BRIEF DESCRIPTION OF THE DRAWINGS

FIGS. 2A and 2B are infrared transmission images of an as-bonded wafer pair and a final SGOI substrate after splitting, respectively;

DETAILED DESCRIPTION OF THE INVENTION

Figure 1A:
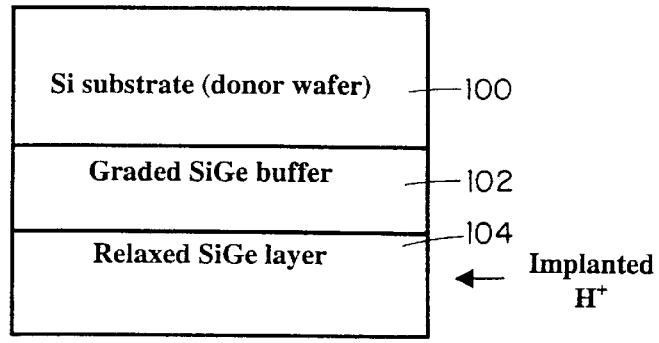
FIGS. 1A–1C are block diagrams showing the process of producing a SGOI substrate in accordance with the invention.

An example of a process in which SGOI is created by layer transfer is described. The experiment was performed in two stages. In the first stage, heteroepitaxial SiGe layers are formed by a graded epitaxial growth technology. Starting with a 4-inch Si (100) donor wafer 100, a linearly stepwise compositionally graded $Si_{1-x}Ge_x$ buffer 102 is deposited with CVD, by increasing Ge concentration from zero to 25%. Then a 2.5 µm relaxed $Si_{0.75}Ge_{0.25}$ cap layer 104 is deposited with the final Ge composition, as shown in FIG. 1A.

Figure 1B:
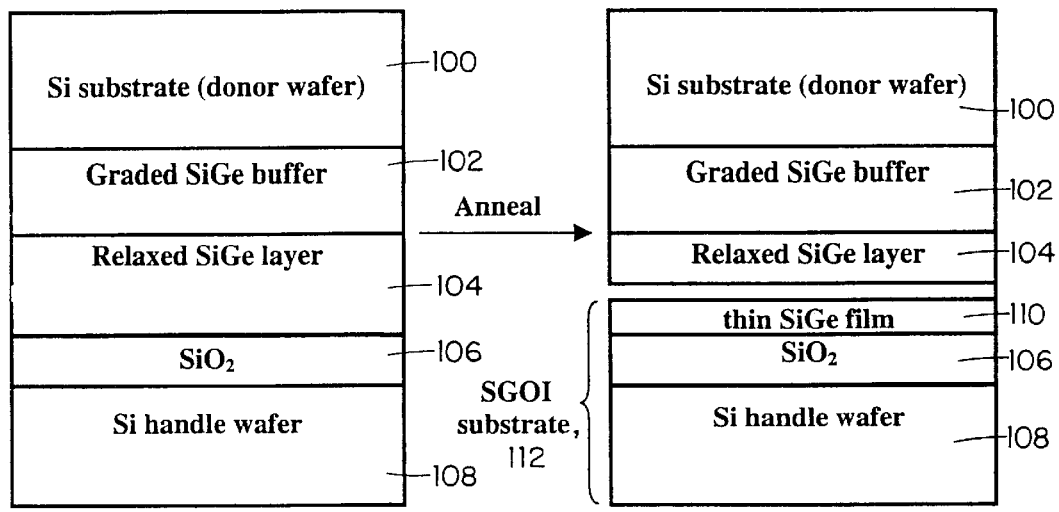

The relaxed SiGe cap layer has high quality with very low dislocation defect density (less than 1E6 /cm$^2$), as the graded buffer accommodates the lattice mismatch between Si and relaxed SiGe. A thin layer of this high quality SiGe will be transferred into the final SGOI structure. The surface of the as-grown relaxed SiGe layer shows a high roughness around 11 nm to 15 nm due to the underlying strain fields generated by misfit dislocations at the graded layer interfaces and thus chemical-mechanical polishing (CMP) is used to smooth the surface. In the second stage, the donor wafer is implanted with hydrogen ion (100 keV, 5E16 H$^+$/cm$^2$) to form a buried hydrogen-rich layer. After a surface clean step in a modified RCA solution, it is bonded to an oxidized 106 Si handle wafer 108 at room temperature as shown in FIG. 1B.

The wafer bonding is one of the key steps, and the bonding energy should be strong enough in order to sustain the subsequent layer transfer in the next step. Good bonding requires a flat surface and a highly hydrophilic surface before bonding. On the other hand, the buried oxide in the final bonded structure is also required to have good electrical properties as it will influence the final device fabricated on it. In the conventional Si film transfer, thermal oxide on the donor wafer is commonly used before H$^+$ implantation and wafer bonding, which becomes the buried oxide in the resulting silicon-on-insulator structure.

The thermal oxide of the Si donor wafer meets all the requirements, as it has good electrical properties, has flat surface and bonds very well to the handle wafer. Unlike the Si, however, the oxidation of SiGe film results in poor thermal oxide quality, and the Ge segregation during oxidation also degrades the SiGe film. Therefore the thermal oxide of SiGe is not suitable for the SGOI fabrication. In one exemplary experiment the SiGe film will be directly bonded to an oxidized Si handle wafer. The high quality thermal oxide in the handle wafer will become the buried oxide in the final SGOI structure.

Having a flat surface after a CMP step, the SiGe wafer went through a clean step. Compared to Si, one difficulty of SiGe film is that, SiGe surface becomes rougher during the standard RCA clean, as the NH$_4$OH in RCA1 solution etches Ge faster than Si. Rough surface will lead to weak bonding as the contact area is reduced when bonded to the handle wafer. In this exemplary embodiment, $H_2SO_4$–$H_2O_2$ solution is used in the place of RCA1, which also meets the clean process requirement for the subsequent furnace annealing after bonding. The SiGe surface after $H_2SO_4$–$H_2O_2$ clean shows better surface roughness compared to RCA1.

Figure 1C:
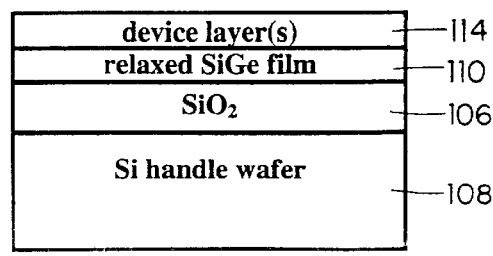

After this modified clean procedure, the SiGe wafer is dipped in the diluted HF solution to remove the old native oxide. It is then rinsed in DI water thoroughly to make the surface hydrophilic by forming a fresh new native oxide layer that is highly active. After spinning dry, the SiGe wafer is bonded to an oxidized handle wafer at room temperature, and then annealed at 600° C. for 3 hours. During anneal the bonded pair split into two sheets along the buried hydrogen-rich layer, and a thin relaxed $Si_{0.75}Ge_{0.25}$ film 110 is transferred into the handle wafer, resulting in a SGOI substrate 112, as shown in FIG. 1B. A final 850° C. anneal improves the $Si_{0.75}Ge_{0.25}$/SiO$_2$ bond. Thereafter, device layers 114 can be processed on the SGOI substrate 112 as shown in FIG. 1C.

Figure 3:
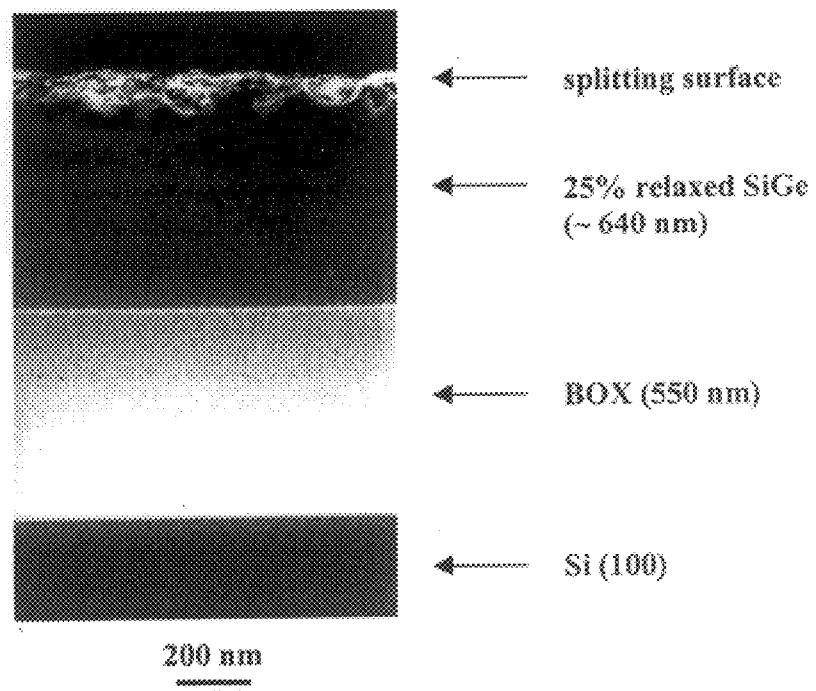
FIG. 3 is a TEM cross-section view of a SiGe layer that was transferred onto the top of a buried oxide.

FIGS. 2A and 2B are infrared transmission images of the as-bonded wafer pair and the final SGOI substrate after splitting, respectively. To investigate the surface of the as-transferred SGOI substrate, transmission electron microscopy (TEM) and atomic force microscopy (AFM) were used. The TEM cross-section view in FIG. 3 shows a ~640 nm SiGe layer was transferred onto the top of a 550 nm buried oxide (BOX). Surface damage is also shown clearly at the splitting surface with a damage depth of ~100 nm.

Figure 4:
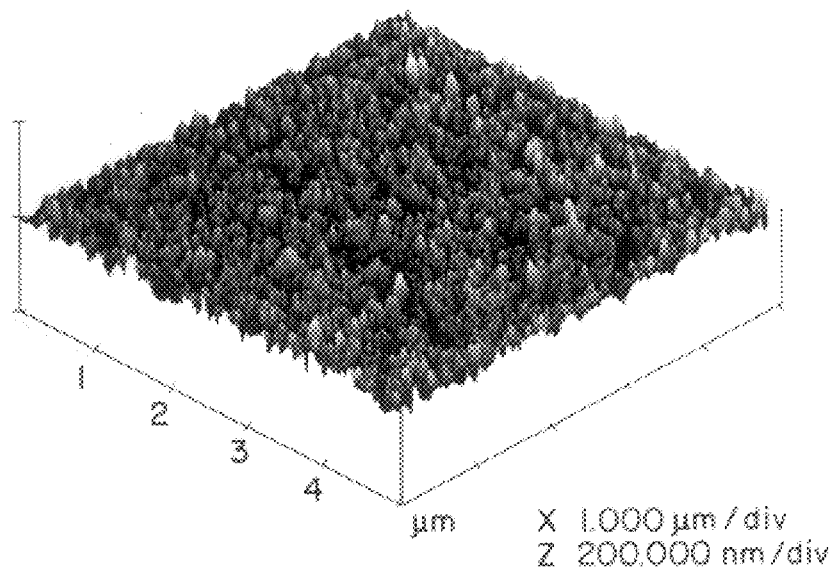
FIG. 4 is an AFM for a transferred SGOI substrate showing surface roughness.

FIG. 4 shows a surface roughness of 11.3 nm in an area of 5×5 µm$^2$ by AFM for the as-transferred SGOI. The data is similar to those from as-transferred silicon film by smart-cut process, and suggests that a top layer of about 100 nm should be removed by a final CMP step. After SiGe film transferring, only a thin relaxed SiGe film is removed and the donor wafer can be used again for a donor wafer. Starting from this general SGOI substrate, various device structures can be realized by growing one or more device layers on the top, as shown in FIG. 1C. Electrical evaluation is in progress by growing a strain Si layer on the top of this SGOI substrate followed by fabrication of strained Si channel devices.

Bond strength is important to the process of the invention. AFM measurements were conducted to investigate the SiGe film surface roughness before bonding under different conditions. One experiment is designed to investigate how long the SiGe surface should be polished to have smooth surface and good bond strength, since the surface of the as-grown relaxed SiGe layer has a high roughness around 11 nm to 15 nm. Several identical 4-inch Si wafers with relaxed $Si_{0.75}Ge_{0.25}$ films were CMPed with optimized polishing conditions for different times. Using AFM, the measured surface microroughness RMS at an area of 10 µm×10 µm is 5.5 Å, 4.5 Å and 3.8 Å, for wafer CMPed for 2 min., 4 min.

and 6 min. respectively. After bonding to identical handle wafers, the tested bond strength increases with decreasing RMS. A CMP time of 6 min. is necessary for good strength.

In another experiment, two identical 4-inch Si wafers with relaxed $Si_{0.75}Ge_{0.25}$ films were CMPed for 8 min. After two cleaning steps in $H_2SO_4{:}H_2O_2$ solution and one step in diluted HF solution, one wafer was put in a new $H_2SO_4{:}H_2O_2$ (3:1) solution and another in a new $NH_4OH{:}H_2O_2{:}H_2O$ (1:1:5), i.e. the conventional RCA1 solution, both for 15 min. The resultant wafers were tested using AFM. The wafer after $H_2SO_4{:}H_2O_2$ solution shows a surface roughness RMS of 2 Å at an area of 1 μm×1 μm, which after $NH_4OH{:}H_2O_2{:}H_2O$ shows 4.4 Å. Clearly, the conventional RCA clean roughens the SiGe surface significantly, and $H_2SO_4{:}H_2O_2$ should be used for SiGe clean.

In yet another experiment, the clean procedure is optimized before bonding. For direct SiGe wafer to oxidized handle wafer bonding (SiGe-oxide bonding), several different clean procedures were tested. It has been found that the $H_2SO_4{:}H_2O_2$ (2~4:1) solution followed by DI water rinse and spin dry gives good bond strength. Alternatively, one can also deposit an oxide layer on the SiGe wafer and then CMP the oxide layer. In this case, SiGe/oxide is bonded to an oxidized handle wafer, i.e. oxide-oxide bonding. Among different clean procedures, it was found that $NH_4OH{:}H_2O_2{:}H_2O$ clean and DI water rinse following by diluted HF, DI water rinse and spin dry gives very good bond strength.

Figure 5:
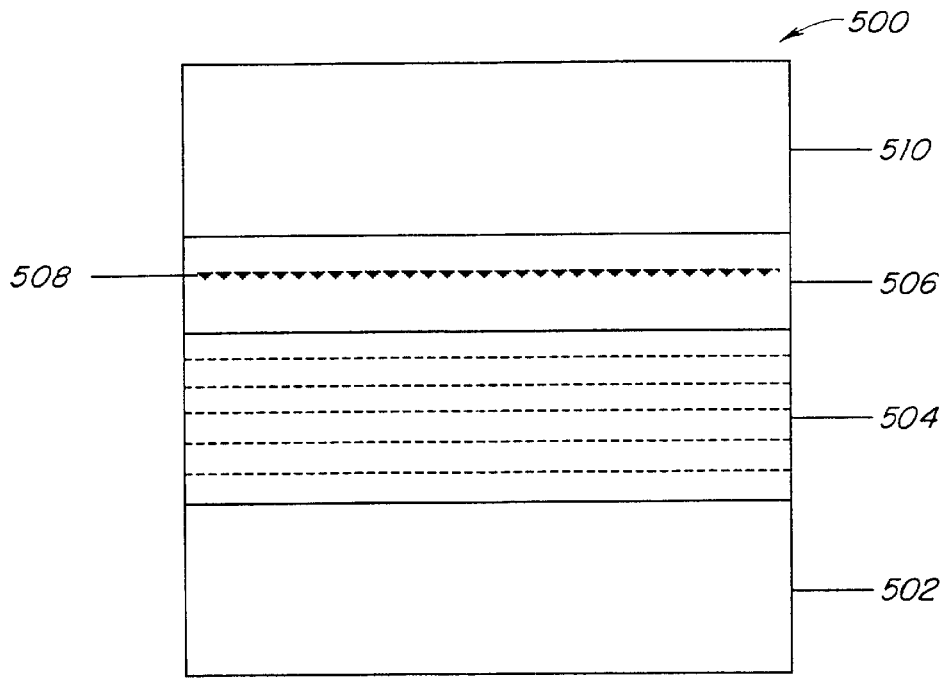
FIGS. 5–8 are block diagrams of various exemplary embodiments semiconductor structures in accordance with the invention.

FIG. 5 is a block diagram of an exemplary embodiment of a semiconductor structure 500 in accordance with the invention. A graded $Si_{1-x}Ge_x$ buffer layer 504 is grown on a silicon substrate 502, where the Ge concentration x is increased from zero to a value y in a stepwise manner, and y has a selected value between 0 and 1. A second relaxed $Si_{1-y}Ge_y$ layer 506 is then deposited, and hydrogen ions are implanted into this layer with a selected depth by adjusting implantation energy, forming a buried hydrogen-rich layer 508. The wafer is cleaned and bonded to an oxidized handle wafer 510. An anneal treatment at 500~600° C. splits the bonded pair at the hydrogen-rich layer 508. As a result, the upper portion of the relaxed $Si_{1-y}Ge_y$ layer 506 remains on the oxidized handle wafer, forming a SGOI substrate. The above description also includes production of Ge-on-insulator where y=1.

During the wafer clean step prior to bonding, the standard RCA clean for the silicon surface is modified. Since the $NH_4OH$ in standard RCA1 solution etches Ge faster than Si, the SiGe surface will become rough, leading to a weak bond. A $H_2SO_4$–$H_2O_2$ solution is used in the place of RCA1, which also meets the clean process requirement for the subsequent furnace annealing after bonding. The SiGe surface after the $H_2SO_4$–$H_2O_2$ clean showed better surface roughness compared to RCA1. After the modified RCA clean, the wafers are then immersed in another fresh $H_2SO_4$–$H_2O_2$ solution for 10 to 20 min. $H_2SO_4$–$H_2O_2$ renders the hydrophilic. After a rinse in DI wafer and spin drying, the SiGe wafer is bonded to an oxidized handle wafer at room temperature immediately, and then annealed at 500~600° C. for wafer splitting.

Figure 6:
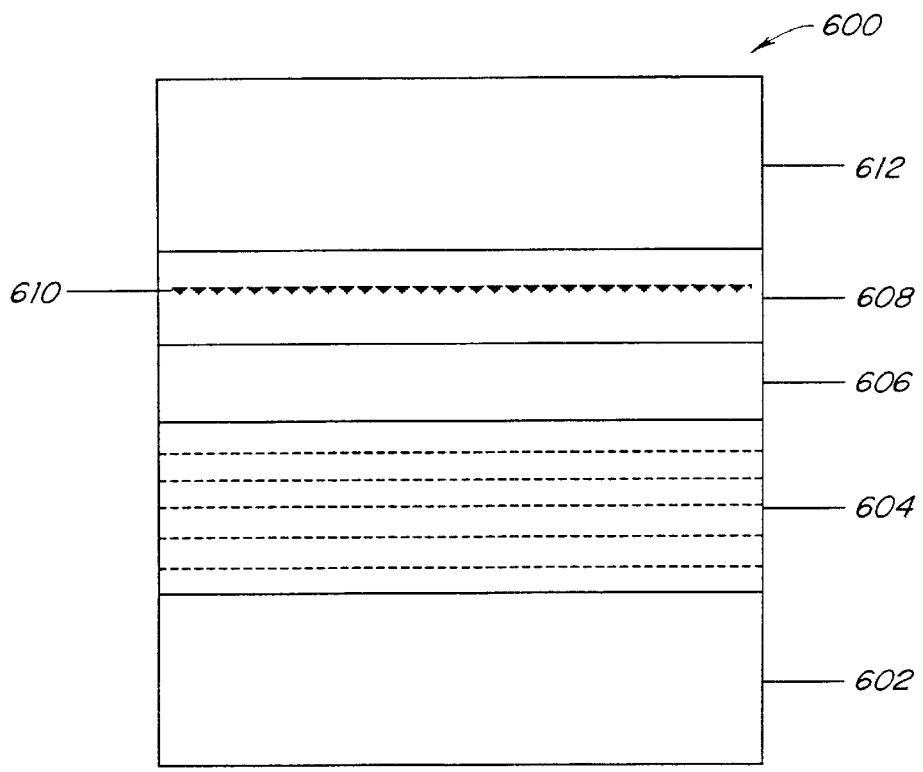

FIG. 6 is a block diagram of another exemplary embodiment of a semiconductor structure 600. The structure 600 includes a graded $Si_{1-x}Ge_x$ buffer layer 604 grown on a silicon substrate 602, where the Ge concentration x is increased from zero to 1. Then a relaxed pure Ge layer 606 and a III–V material layer 608, such as a GaAs layer, are epitaxially grown on the Ge layer. Hydrogen ions are implanted into the GaAs layer 608 with a selected depth by adjusting implantation energy, forming a buried hydrogen-rich layer 610. The wafer is cleaned and bonded to an oxidized handle wafer 612. An anneal treatment splits the bonded pair at the hydrogen-rich layer 610. As a result, the upper portion of the GaAs layer 608 remains on the oxidized handle wafer, forming a GaAs-on-insulator substrate.

Figure 7:
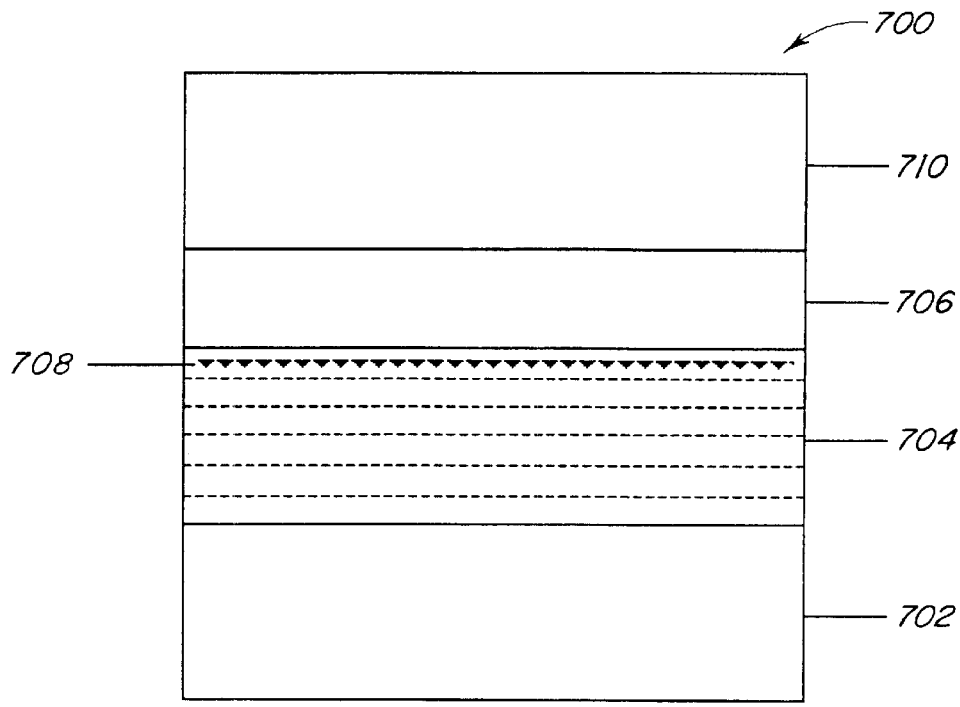

FIG. 7. is a block diagram of yet another exemplary embodiment of a semiconductor structure 700. A graded $Si_{1-x}Ge_x$ buffer layer 704 is grown on a silicon substrate 702, where the Ge concentration x is increased from zero to a selected value y, where y is less than 0.2. A second relaxed $Si_{1-z}Ge_z$ layer 706 is deposited, where z is between 0.2 to 0.25. Hydrogen ions are implanted into the graded $Si_{1-x}Ge_x$ buffer layer 704 with a selected depth, forming a buried hydrogen-rich layer 708 within layer 704. The wafer is cleaned and bonded to an oxidized handle wafer 710. An anneal treatment at 500~600° C. splits the bonded pair at the hydrogen-rich layer 708.

As a result, the upper portion of the graded $Si_{1-x}Ge_x$ buffer layer 704 and the relaxed $Si_{1-z}Ge_z$ layer 706 remains on the oxidized handle wafer 710. The remaining graded $Si_{1-x}Ge_x$ buffer layer 704 is then selectively etched by either KOH or TMAH. KOH and TMAH etch $Si_{1-x}Ge_x$ fast when x is less 0.2, but becomes very slow when x is larger than 0.2. Thus, the graded $Si_{1-x}Ge_x$ buffer layer 704 can be etched selectively, leaving the relaxed $Si_{1-z}Ge_z$ layer 706 on the insulating substrate 710 and forming a relaxed SGOI substrate. In this process, the thickness of the relaxed $Si_{1-z}Ge_z$ film 706 on the final SGOI structure is defined by film growth, which is desired in some applications.

Figure 8:
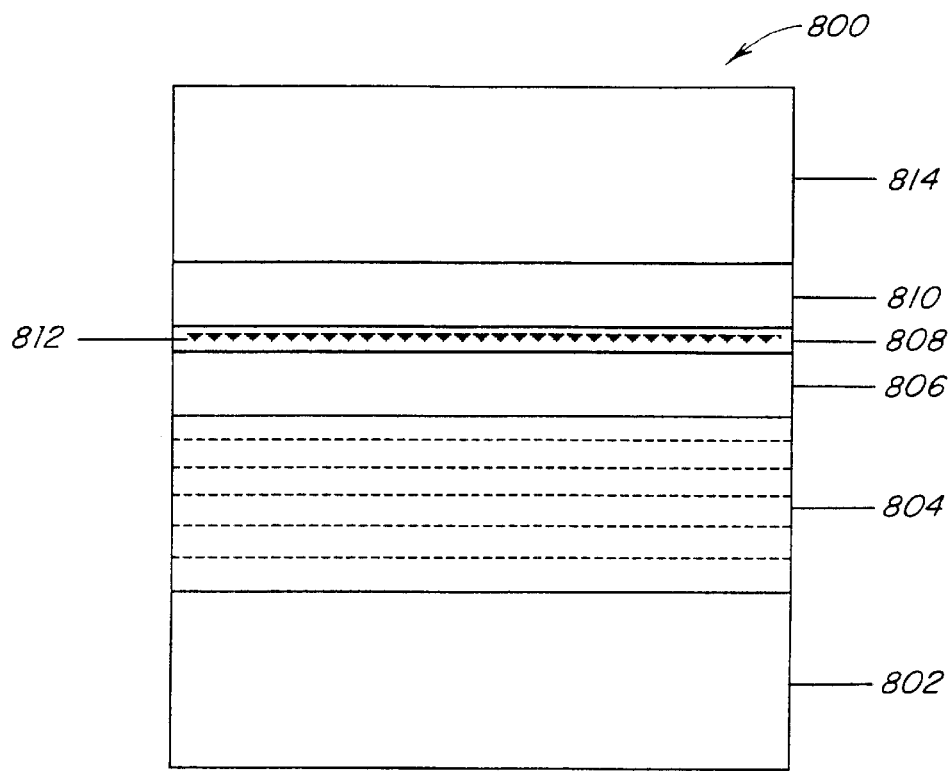

FIG. 8 is a block diagram of yet another exemplary embodiment of a semiconductor structure 800. A graded $Si_{1-x}Ge_x$ buffer layer 804 is grown on a silicon substrate 802, where the Ge concentration x is increased from zero to a selected value y between 0 and 1. A second relaxed $Si_{1-y}Ge_y$ layer 806 is deposited, followed by a strained $Si_{1-z}Ge_z$ layer 808 and another relaxed $Si_{1-y}Ge_y$ layer 810. The thickness of layers 806, 808, and 810, and the value z are chosen such that the $Si_{1-z}Ge_z$ layer 808 is under equilibrium strain state while the $Si_{1-y}Ge_y$ layers 806 and 810 remain relaxed. In one option, hydrogen ions may be introduced into the strained $Si_{1-z}Ge_z$ layer 808, forming a hydrogen-rich layer 812. The wafer is cleaned and bonded to an oxidized handle wafer 814. The bonded pair is then separated along the strained $Si_{1-z}Ge_z$ layer 808.

Since the strain makes the layer weaker, the crack propagates along this layer during separation. The separation can be accomplished by a variety of techniques, for example using a mechanical force or an anneal treatment at 500~600° C. when the hydrogen is also introduced. See, for example, U.S. Pat. Nos. 6,033,974 and 6,184,111, both of which are incorporated herein by reference. As a result, the relaxed $Si_{1-y}Ge_y$ layer 810 remains on the oxidized handle wafer, forming a relaxed SGOI substrate. The thickness of layers 806, 808, and 810, and the value z may also be chosen such that there are a good amount of dislocations present in the $Si_{1-z}Ge_z$ layer 808 while the top $Si_{1-y}Ge_y$ layer 810 remains relaxed and having high quality and limited dislocation defects.

These dislocation defects in the $Si_{1-z}Ge_z$ layer 808 can then act as hydrogen trap centers during the subsequent step of introducing ions. The hydrogen ions may be introduced by various ways, such as ion implantation or ion diffusion or drift by means of electrolytic charging. The value of z may be chosen in such a way that the remaining $Si_{1-z}Ge_z$ layer 808 can be etched selectively by KOH or TMAH. The layers 806 and 810 may also be some other materials, for example pure Ge, or some III–V materials, under the condition that the Ge concentration x in the graded $Si_{1-x}Ge_x$ buffer layer 804 is increased from zero to 1.

After all the semiconductor-on-insulator substrate obtained by the approaches described above, various device layers can be further grown on the top. Before the regrowth, CMP maybe used to polish the surface.

Although the present invention has been shown and described with respect to several preferred embodiments thereof, various changes, omissions and additions to the form and detail thereof, may be made therein, without departing from the spirit and scope of the invention.

What is claimed is:

1. A method for forming a semiconductor structure, the method comprising:
   forming a first heterostructure by:
      depositing a graded $Si_{1-x}Ge_x$ buffer layer on a first substrate, the graded $Si_{1-x}Ge_x$ buffer layer having a Ge concentration x increasing from zero to a value y;
      depositing a relaxed $Si_{1-y}Ge_y$ layer on the graded $Si_{1-x}Ge_x$ buffer layer; and
      introducing ions into said relaxed $Si_{1-y}Ge_y$ layer to form a buried layer;
   bonding said first heterostructure to a second substrate to form a second heterostructure; and
   splitting said second heterostructure at the buried layer, wherein a top portion of said relaxed $Si_{1-y}Ge_y$ layer remains on said second substrate after the second heterostructure is split.

2. The method of claim 1, further comprising:
   forming at least one of a device layer and a device, after said step of depositing said relaxed $Si_{1-y}Ge_y$ layer.

3. The method of claim 2, wherein said at least one device layer comprises at least one of strained Si, strained $Si_{1-w}Ge_w$ with w≠y, strained Ge, a III–V compound, and a II–VI compound.

4. The method of claim 1, further comprising:
   forming an insulating layer over said relaxed $Si_{1-y}Ge_y$ layer before said step of introducing ions.

5. The method of claim 1, further comprising:
   planarizing said relaxed $Si_{1-y}Ge_y$ layer, before said step of introducing ions.

6. The method of claim 1, wherein said ions comprise at least one of hydrogen $H^+$ ions and $H_2^+$ ions.

7. The method of claim 1, further comprising:
   planarizing said relaxed $Si_{1-y}Ge_y$ layer, after said step of introducing ions.

8. The method of claim 1, further comprising:
   cleaning at least one of said first heterostructure and second substrate, before said step of bonding.

9. The method of claim 1, wherein splitting said second heterostructure comprises annealing.

10. The method of claim 1, wherein splitting said second heterostructure comprises mechanical force.

11. The method of claim 1, further comprising:
    removing the top portion of said relaxed $Si_{1-y}Ge_y$ layer, after said step of splitting.

12. The method of claim 1, further comprising:
    forming at least one of a device layer and a device, after said step of splitting.

13. The method of claim 12, wherein said device layer comprises at least one of strained Si, relaxed $Si_{1-y}Ge_y$, strained $Si_{1-w}Ge_w$, strained Ge, a III–V compound, and a II–VI compound.

14. The method of claim 1, further comprising:
    re-using the remaining first heterostructure, after said step of splitting.

15. The method of claim 1, wherein said first substrate comprises monocrystalline silicon.

16. A method for forming a semiconductor layer, the method comprising:
    forming a first heterostructure by:
       depositing a graded $Si_{1-x}Ge_x$ buffer layer on a first substrate, the graded $Si_{1-x}Ge_x$ buffer layer having a Ge concentration x increasing from zero to 1;
       depositing a relaxed Ge layer on the graded $Si_{1-x}Ge_x$ buffer layer;
       forming a semiconductor layer on the relaxed Ge layer; and
       introducing ions into said semiconductor layer to form a buried layer;
    bonding said first heterostructure to a second substrate to form a second heterostructure; and
    splitting said second heterostructure at the buried layer, wherein a top portion of said semiconductor layer remains on said second substrate after the second heterostructure is split.

17. The process of claim 16, wherein said semiconductor layer comprises one of GaAs, AlAs, ZnSe and InGaP.

18. The process of claim 16 further comprising forming at least one device layer or a plurality of integrated circuit devices, after said step of forming said semiconductor layer.

19. The process of claim 16 further comprising forming an insulating layer before said step of introducing ions.

20. The process of claim 16 further comprising planarizing said semiconductor layer before said step of introducing ions.

21. The process of claim 16, wherein said ions comprise hydrogen $H^+$ ions or $H_2^+$ ions.

22. The process of claim 16, further comprising the step of planarizing said semiconductor layer after said step of introducing ions.

23. The process of claim 16 further comprising cleaning both said first heterostructure and said second substrate, before said step of bonding.

24. The process of claim 16, wherein said second heterostructure is split by annealing.

25. The process of claim 16, wherein said second heterostructure is split by annealing and followed by mechanical force.

26. The process of claim 16 further comprising removing the top portion of the remaining of said third semiconductor layer, after said step of splitting.

27. The process of claim 16 further comprising forming at least one device layer or a plurality of integrated circuit devices, after said step of splitting.

28. The process of claim 16 further comprising re-using the remaining first heterostructure, after said step of splitting.

29. The process of claim 16, wherein said first substrate comprises monocrystalline silicon.

30. A method for forming a semiconductor structure, the method comprising:
    forming a first heterostructure by:
       depositing a graded $Si_{1-x}Ge_x$ buffer layer on a substrate, graded $Si_{1-x}Ge_x$ buffer layer having a Ge concentration x increasing from zero to a value y;
       depositing a relaxed $Si_{1-z}Ge_z$ layer on the graded $Si_{1-x}Ge_x$ buffer layer, z being greater than y; and introducing ions into said graded $Si_{1-x}Ge_x$ buffer layer to define a buried layer;

bonding said first heterostructure to a second substrate to define a second heterostructure;

splitting said second heterostructure at the buried layer, wherein an upper portion of the graded $Si_{1-x}Ge_x$ layer and said $Si_{1-z}Ge_z$ layer remain on said second substrate after the second heterostructure is split; and selectively etching the remaining portion of said graded $Si_{1-x}Ge_x$ layer, wherein said relaxed $Si_{1-z}Ge_z$ layer remains on said second substrate after the selective etch.

31. The process of claim 30 further comprising forming at least one device layer or a plurality of integrated circuit devices, after said step of forming said relaxed $Si_{1-z}Ge_z$ layer.

32. The process of claim 31, wherein said at least one device layer includes one or more of strained Si, strained $Si_{1-w}Ge_w$ with w≠z, and strained Ge.

33. The process of claim 30 further comprising forming an insulating layer before said step of introducing ions.

34. The process of claim 30 further comprising planarizing said relaxed $Si_{1-z}Ge_z$ layer before said step of introducing ions.

35. The process of claim 30, wherein said ions comprise hydrogen $H^+$ ions or $H_2^+$ ions.

36. The process of claim 30 further comprising planarizing the relaxed $Si_{1-z}Ge_z$ layer after said step of introducing ions.

37. The process of claim 30 further comprising cleaning both said first heterostructure and said second substrate, before said step of bonding.

38. The process of claim 30, wherein said second heterostructure is split by annealing.

39. The process of claim 30 further comprising planarizing said second relaxed $Si_{1-z}Ge_z$ layer after said step of etching.

40. The process of claim 30 further comprising forming at least one device layer or a plurality of integrated circuit devices, after said step of etching.

41. The method of claim 1, wherein the second substrate comprises an insulator layer and the first heterostructure is bonded to the insulator layer.

42. The method of claim 41, wherein the insulator layer comprises an oxide layer.

43. A method for forming a semiconductor structure, the method comprising:

defining a first heterostructure by:

forming a layer structure by:

depositing a graded $Si_{1-x}Ge_x$ buffer layer on a first substrate, wherein the Ge concentration x increases from zero to a value y;

depositing a relaxed $Si_{1-z}Ge_z$ layer over the graded $Si_{1-x}Ge_x$ buffer layer; and forming a buried layer in the layer structure;

bonding the first heterostructure to a second substrate to define a second heterostructure; and splitting the second heterostructure at the buried layer, wherein at least a portion of the layer structure remains on the second substrate after splitting.

44. A method for forming a semiconductor structure, the method comprising:

defining a first heterostructure by:

forming a layer structure by:

depositing a graded $Si_{1-x}Ge_x$ buffer layer on a first substrate, wherein the Ge concentration x increases from zero to a value y; and depositing a relaxed $Si_{1-z}Ge_z$ layer over the graded $Si_{1-x}Ge_x$ buffer layer; and introducing ions into the layer structure to form a buried layer;

bonding the first heterostructure to a second substrate to define a second heterostructure; and splitting the second heterostructure at the buried layer, wherein at least a portion of the layer structure remains on the second substrate after the second heterostructure is split.

* * * * *

UNITED STATES PATENT AND TRADEMARK OFFICE
CERTIFICATE OF CORRECTION

| | |
|---|---|
| PATENT NO. | : 6,573,126 B2 |
| APPLICATION NO. | : 09/928126 |
| DATED | : June 3, 2003 |
| INVENTOR(S) | : Cheng et al. |

It is certified that error appears in the above-identified patent and that said Letters Patent is hereby corrected as shown below:

Column 1, between lines 6, ending "Aug. 16, 2000.", and line 8, beginning "BACKGROUND", insert the following paragraph:

--GOVERNMENT LICENSE RIGHTS

This invention was made with government support under Contract Number N66001-00-1-8954, awarded by the Navy. The government has certain rights in the invention.--

Signed and Sealed this

Twenty-ninth Day of May, 2007

JON W. DUDAS
*Director of the United States Patent and Trademark Office*